US010372846B2

(12) United States Patent
Bai et al.

(10) Patent No.: US 10,372,846 B2
(45) Date of Patent: Aug. 6, 2019

(54) RETRIEVING POLLUTION EMISSION SOURCE USING CFD AND SATELLITE DATA (71) Applicant: INTERNATIONAL BUSINESS MACHINES CORPORATION, Armonk, NY (US)

(72) Inventors: Xin Xin Bai, Beijing (CN); Jin Dong, Beijing (CN); Hui Bj Du, Beijing (CN); Xiao Guang Rui, Beijing (CN); Hai Feng Hf Wang, Beijing (CN); Bao Guo Bg Xie, Beijing (CN); Wen Jun Yin, Beijing (CN); Meng Mm Zhang, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 884 days.

(21) Appl. No.: 14/938,963

(22) Filed: Nov. 12, 2015

(65) Prior Publication Data
US 2017/0140075 A1 May 18, 2017

(51) Int. Cl.
G06F 17/50 (2006.01)
B01D 53/30 (2006.01)
(Continued)

(52) U.S. Cl.
CPC ......... *G06F 17/5009* (2013.01); *B01D 53/30* (2013.01); *B01D 53/56* (2013.01);
(Continued)

(58) Field of Classification Search
CPC .................................................. G06F 17/5009
(Continued)

(56) References Cited

U.S. PATENT DOCUMENTS 6,952,945 B2 * 10/2005 O'Brien ............... G01N 1/2202
73/23.2
8,949,037 B2   2/2015 Prince et al.
(Continued)

FOREIGN PATENT DOCUMENTS

| CN | 102628852 | 8/2012 |
| CN | 102944880 | 2/2013 |
| CN | 103065198 | 4/2013 |

OTHER PUBLICATIONS

Claudio A. Belis, et al., "European Guide on Air Pollution Source Apportionment with Receptor Models", JRC Reference Reports, 2014.
(Continued)

*Primary Examiner* — Thai Q Phan
(74) *Attorney, Agent, or Firm* — F. Chau & Associates, LLC (57) ABSTRACT A method for modeling air pollution includes receiving a weather model for a particular geographic region. Satellite-observed pollution observation data over the geographic region is received. A physical dispersion model for pollution over the geographic region is generated using the received weather model. The received satellite-observed pollution observation data is interpolated to the generated physical model. The interpolated satellite-observed pollution observation data and the generated physical model are combined using weighted coefficients for both the interpolated satellite-observed pollution observation data and the generated physical model. The weighted coefficients are calculated in accordance with a relative error in both the physical dispersion model and the satellite-observed pollution observation data.

20 Claims, 4 Drawing Sheets (51) Int. Cl.
*G01W 1/10* (2006.01)
*B01D 53/56* (2006.01)
*H04W 4/021* (2018.01)

(52) U.S. Cl.
CPC ........... *G01W 1/10* (2013.01); *G06F 17/5018* (2013.01); *H04W 4/021* (2013.01)

(58) Field of Classification Search
USPC ........................................................ 703/2, 5
See application file for complete search history.

(56) References Cited

U.S. PATENT DOCUMENTS

| | | | | |
|---|---|---|---|---|
| 10,036,135 | B2* | 7/2018 | Dunlap | ................ E02B 15/0814 |
| 2004/0012787 | A1* | 1/2004 | Galle | ................ G01N 21/3504 |
| | | | | 356/437 |
| 2004/0035183 | A1* | 2/2004 | O'Brien | ................ G01N 1/2202 |
| | | | | 73/23.27 |
| 2007/0271997 | A1* | 11/2007 | O'Brien | ................ G01N 1/2202 |
| | | | | 73/23.37 |
| 2010/0116021 | A1* | 5/2010 | O'Brien | ................ G01N 1/2202 |
| | | | | 73/23.37 |
| 2010/0154941 | A1* | 6/2010 | Zhou | ........................ C04B 5/00 |
| | | | | 148/513 |
| 2011/0251800 | A1 | 10/2011 | Wilkins | |
| 2014/0257772 | A1 | 9/2014 | Perot et al. | |
| 2017/0091350 | A1* | 3/2017 | Bauer | ................ G06F 17/5095 |

OTHER PUBLICATIONS

Claudio A. Belis, et al., "WP 2 Review and gaps identification in Air Quality and Health Assessment methodologies at regional and local scale", Appraisal/JRC-IES/WP 2/D2.6/Version 1.1 , Apr. 30, 2013.

* cited by examiner

Mercury emission 2010, g/km² 0 2 5 10 100 1000

RETRIEVING POLLUTION EMISSION SOURCE USING CFD AND SATELLITE DATA

BACKGROUND

1. Technical Field

The present disclosure relates to retrieving pollution sources and, more specifically, to a method for retrieving pollution emission source using CFD and satellite data.

2. Discussion of Related Art

Air pollution is the introduction of harmful materials into the Earth's atmosphere. Air pollution can be harmful to human health and wellbeing and may have other important negative consequences for the Earth and its ecosystems.

Obtaining an accurate measure of present air pollution may be important for protecting people from harmful effects of air pollution, accurately targeting remedial actions, and producing insightful long-term studies on the progression of air pollution.

Air pollution generally originates from various emission sources, and providing a quantitative understanding and visualization of various emission sources may be an important part of obtaining accurate measurements of present air quality and pollution distribution.

BRIEF SUMMARY

A method for modeling air pollution includes receiving a weather model for a particular geographic region. Satellite-observed pollution observation data over the geographic region is received. A physical dispersion model for pollution over the geographic region is generated using the received weather model. The received satellite-observed pollution observation data is interpolated to the generated physical model. The interpolated satellite-observed pollution observation data and the generated physical model are combined using weighted coefficients for both the interpolated satellite-observed pollution observation data and the generated physical model. The weighted coefficients are calculated in accordance with a relative error in both the physical dispersion model and the satellite-observed pollution observation data.

The satellite-observed pollution observation data may have a courser resolution than the physical dispersion model. The generated physical dispersion model may be a computed fluid dynamics (CFD) model.

The physical dispersion model may be generated from the received weather model using one or more observed emissions levels taken at one or more observation stations. The physical dispersion model may be generated from the received weather model using one or more observed emissions levels taken from the satellite-observed pollution observation data.

The physical dispersion model may be optimized by minimizing a difference between one or more observed emissions levels taken at one or more observation stations and calculated emissions levels at locations of the one or more observation stations that are calculated from the physical dispersion model. The physical dispersion model may be optimized by minimizing a difference between one or more observed emissions levels taken from the satellite-observed pollution observation data at one or more locations and calculated emissions levels at the one or more locations that are calculated from the physical dispersion model.

The relative error in both the physical dispersion model and the satellite-observed pollution observation data may be calculate based on a calculated inversing model error of the physical dispersion model and a predetermined error of the satellite-observed pollution observation data.

The method may further comprise displaying the combined interpolated satellite-observed pollution observation data and the generated physical dispersion model as a visual representation of air pollution levels over the particular geographic region.

A method for modeling air pollution includes receiving a weather model for a particular geographic region. Satellite-observed pollution observation data over the geographic region is received. A physical dispersion model for pollution over the geographic region is generated using the received weather model. The received satellite-observed pollution observation data is interpolated to the generated physical model. The generated physical dispersion model is optimized by minimizing a difference between one or more observed emissions levels taken from the satellite-observed pollution observation data at one or more locations and calculated emissions levels at the one or more locations that are calculated from the physical dispersion model.

The satellite-observed pollution observation data may have a courser resolution than the physical dispersion model. The generated physical dispersion model may be a computed fluid dynamics (CFD) model.

The method may further include displaying the optimized physical dispersion model as a visual representation of air pollution levels over the particular geographic region.

A computer system includes a processor and a non-transitory, tangible, program storage medium, readable by the computer system, embodying a program of instructions executable by the processor to perform method steps for modeling air pollution. The method includes receiving a weather model for a particular geographic region. Satellite-observed pollution observation data over the geographic region is received. A physical dispersion model for pollution over the geographic region is generated using the received weather model. The received satellite-observed pollution observation data is interpolated to the generated physical model. The interpolated satellite-observed pollution observation data and the generated physical model are combined using weighted coefficients for both the interpolated satellite-observed pollution observation data and the generated physical model. The weighted coefficients are calculated in accordance with a relative error in both the physical dispersion model and the satellite-observed pollution observation data.

The satellite-observed pollution observation data may have a courser resolution than the physical dispersion model. The generated physical dispersion model may be a computed fluid dynamics (CFD) model.

The physical dispersion model may be generated from the received weather model using one or more observed emissions levels taken at one or more observation stations. The physical dispersion model may be generated from the received weather model using one or more observed emissions levels taken from the satellite-observed pollution observation data. The physical dispersion model may be optimized by minimizing a difference between one or more observed emissions levels taken at one or more observation stations and calculated emissions levels at locations of the one or more observation stations that are calculated from the physical dispersion model.

The method may further include displaying the combined interpolated satellite-observed pollution observation data and the generated physical dispersion model as a visual representation of air pollution levels over the particular geographic region.

BRIEF DESCRIPTION OF THE SEVERAL VIEWS OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Emission sources of air pollution may be measured using computed fluid dynamics (CFD) or satellite data. CFD, which may also be known as computational fluid dynamics, or fluid simulation, is a computer graphics tool used to generate a realistic representation of the manner in which, as applied to the modeling of air pollution, pollutants released into the atmosphere, diffuse and concentrate. By providing the model with accurate data pertaining to the emission sources and atmospheric conditions, CFD may be used to visualize present pollution characteristics and to accurately predict the future course of pollution distribution.

Figure 1:
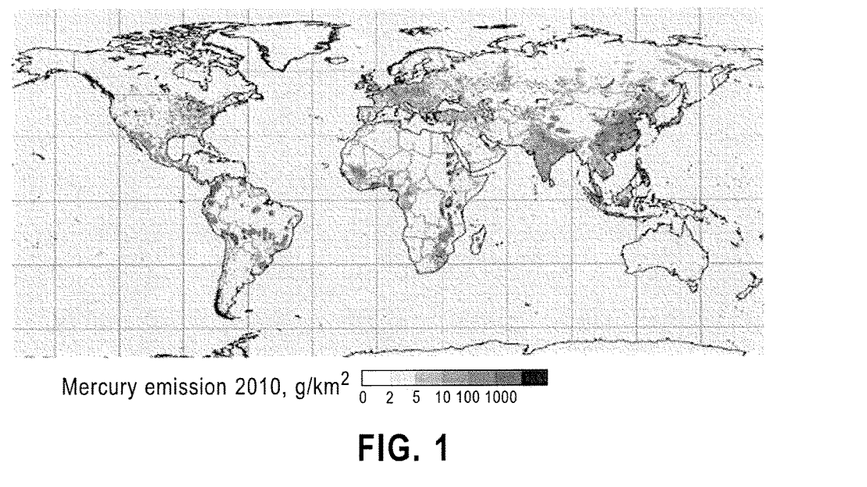
FIG. 1 is an illustration of a pollution map over a geographic area in accordance with exemplary embodiments of the present invention.

FIG. 1 is an illustration of a pollution map over a geographic area in accordance with exemplary embodiments of the present invention. CFD may utilize physical dispersion modeling, which may be developed, for example, by adopting a multi-grid system. In this multi-grid system, the physical dispersion equation may be solved on a finer grid system, of which resolution may be $\delta x = \delta y = 400$ m, while the course grid system is used to approximate the source emission over a geographic area with a resolution of $\Delta x = \Delta = 5$ km. In the present grid system, the pollution emission surface $G(x)$ may be approximated using a Gaussian kernel, as:

$$G(x) \sum_{i=1}^{45} Q(x; \beta_i, x_i^s), \; Q(x; \beta_i, x_i^s) = \frac{\beta_i}{2\pi\sigma^2} \exp\left(-\frac{|x - x_i^s|^2}{2\sigma^2}\right)$$

in which $x_i^s$ the i-th grid point of the coarse grid system, e.g. the center of the pollution kernel, $\sigma = 0.6\Delta x$ is a length scale of the kernel, and $\beta_i$ is the emission strength at i-th grid point in the unit of ton/year or µg/sec.

Here, $X_{i1}$, (i=1, ..., N), is defined as the solution of the physical dispersion model ($\mathcal{L}(x,t; x_i^s)$) for $Q(x, \beta_i, x_i^s)$ at time t at N receptor, or observation site locations (x'). $X_{it} = [(\mathcal{D}_1^r, \ldots, \mathcal{D}_N^r)\mathcal{L}(x,t;x_i^s)]^T$, $\mathcal{D}_j^r f(x) = \int \delta(x_j^s - x)f(x)dx$, in which $\mathcal{D}_j^r$ is a Dirac delta operator to subset the pollution concentration values at the receptor locations for the computer model output. From this compute model output, the pollution concentration at time t may be estimated as:

$$Y_t = \sum_i \{X_{it}\beta_i + \epsilon_{it}\}.$$

Here, $\epsilon_{it}$ is a spatio-temporal error process. The emissions rate $\beta$ may be estimated.

Figure 2:
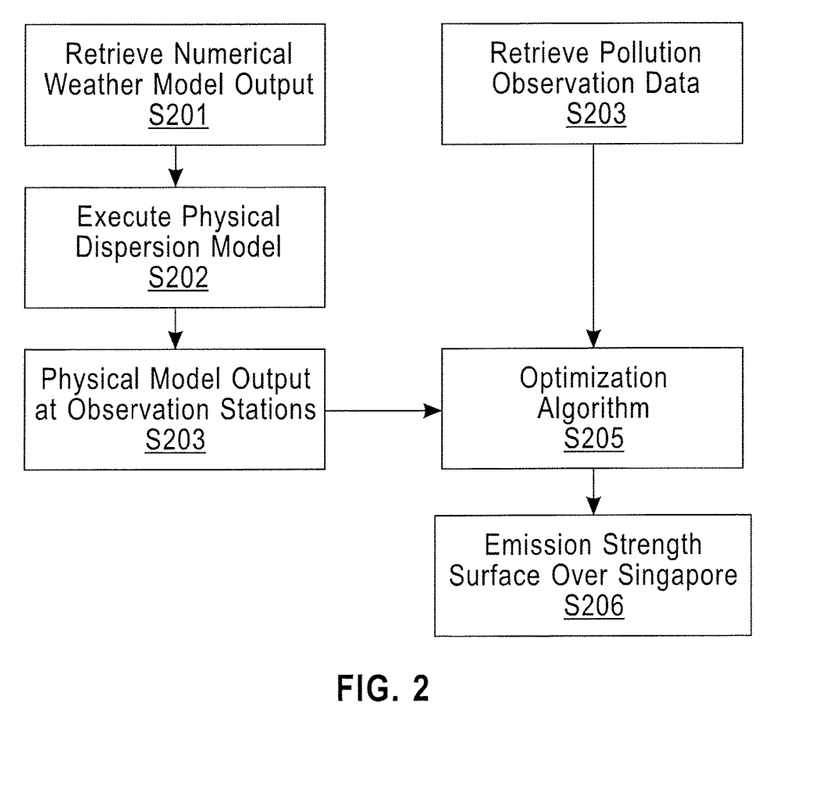
FIG. 2 is a flow chart illustrating an approach for performing CFD to understand pollution emission strength over a geographic are in accordance with exemplary embodiments of the present invention.

FIG. 2 is a flow chart illustrating an approach for performing CFD to understand pollution emission strength over a geographic are, for example, Singapore, in accordance with exemplary embodiments of the present invention. First, a quantitative weather model may be provided (Step S201). This weather model may be obtained from one or more conventional weather modeling techniques. The weather model may cover a limited geographic region, for example, Singapore. A physical disbursement model may then be created for the limited geographic region (Step S202). The physical disbursement model may model a manner in which pollution emission sources may propagate through the geographic region, given boundary conditions and the weather model. The boundary conditions used may include, for example, the emissions outputs at one or more known emissions sources. The constructed physical dispersion model may be used to predict air conditions at one or more observation stations (Step S203). These predictions may be cross-checked against actual pollution data at the observation stations (Step S204) and the model may be optimized to reduce any differences between what is predicted and what is observed at the given stations (Step S205). The optimized model may then be used to predict emission strength over the entire geographic region (Step S206).

However, it is noted that the above approach is sensitive to errors in the weather model, and as weather models may not always be highly accurate, the resulting emission strength map may be similarly error prone.

Exemplary embodiments of the present invention may also utilize an alternative approach for visualizing pollution levels over a geographic region. This alternative approach may utilize satellite observation. According to satellite observation techniques, photographic images, radar images, or the like may be acquired of the geographic region from a satellite in orbit around the earth. As levels of pollution may be observable by these means, an actual pollution distribution may be obtained. For example, spectrum analysis techniques may be used to determine what chemicals may be within the atmosphere.

Figure 3:
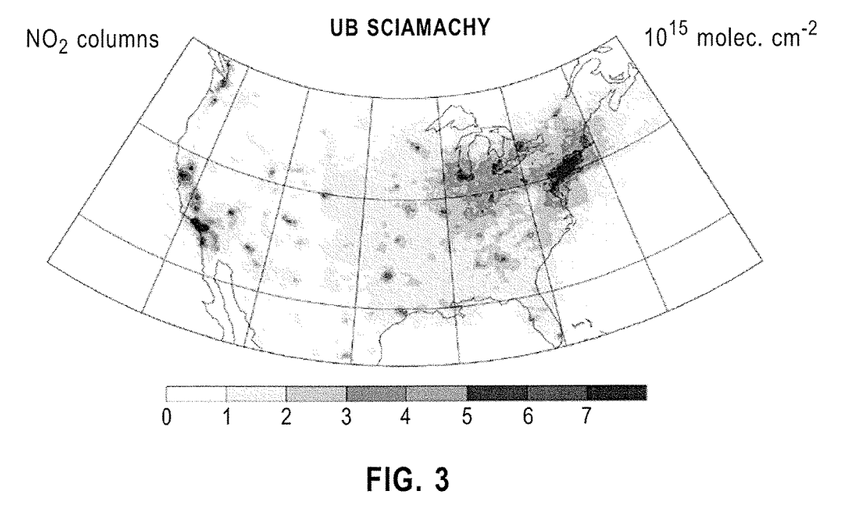
FIG. 3 is an illustration of a satellite-observed pollution distribution map over a geographic region in accordance with exemplary embodiments of the present invention.

FIG. 3 is an illustration of a satellite-observed pollution distribution map over a geographic region, here the United States of America. As can be seen from this figure, pollution levels may be understood over the entire geographic region using this graph that may be generated based on satellite-acquired imagery and/or data.

However, satellite observations of pollution distribution may suffer from the shortcomings of poor resolution and/or accuracy.

Accordingly, exemplary embodiments of the present invention provide a hybrid approach to pollution distribution modeling that makes use of both satellite observations and physical modeling that may be more accurate than techniques for pollution distribution analysis that only involve one or the other technique. According to this approach, satellite data may be used to create a course pollution source observation while fine background pollution sources are modeled using a process similar to CFD, as described above. The course satellite data may be interpolated onto the fine CFD model and an enhanced pollution source mapping may be generated therefrom. In optimizing this model, CFD error may be calculated using an "ensemble" approach which is introduced herein.

According to this ensemble approach, the error for the satellite data, which may be generally known, is compared to the CFD inversing model error, which may vary and is thus calculated in accordance with exemplary embodiments of the present invention, and the relative degrees of error are used to weight the contribution of the corresponding approach. Thus, CFD inversing model may be afforded increased weight in cased in which the CFD error is relatively low while the satellite data may be afforded increased weight in cases in which the CFD inversing model error is relatively high.

According to an alternative, or complementary approach, rather than optimizing the physical model by minimizing a difference in the predicted pollution levels and the observed pollution levels at a set of one or more observation stations, as described above, satellite data may be used to create, in essence, a super-large set of virtual observation stations and then optimization of the model may be performed over this entire set of virtual observations, or alternatively, over the continuous geographical region, to achieve a higher level of accuracy over the limited set of observation stations described above.

Figure 4:
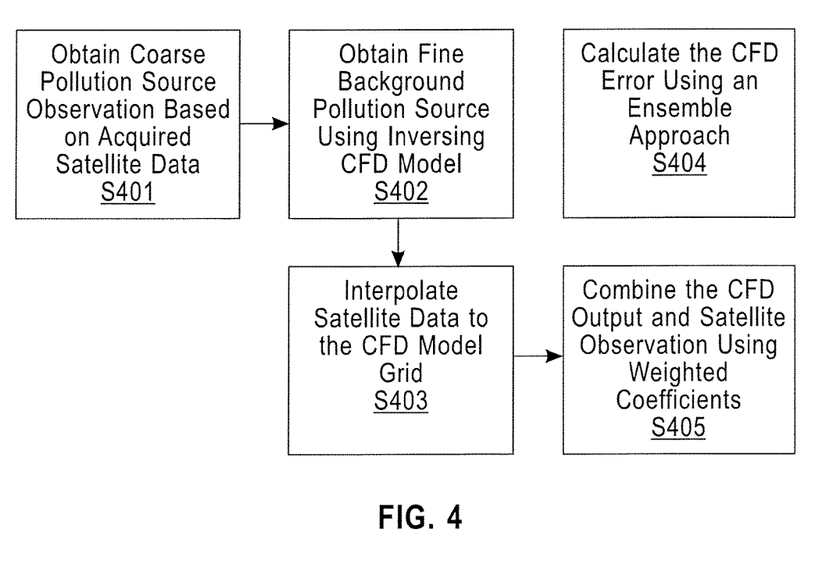
FIG. 4 is a flow chart illustrating an approach for utilizing satellite-based pollution emission strength in physically modeling pollution over a geographic area in accordance with exemplary embodiments of the present invention

FIG. 4 is a flow chart illustrating an approach for utilizing satellite-based pollution emission strength in physically modeling pollution over a geographic area, for example, the United States of America, in accordance with exemplary embodiments of the present invention.

First, a coarse pollution source observation may be created from acquired satellite data (Step S401). The pollution source observation may be a diagram showing concentrations of pollutant gasses such as NOx, SOx, and CO. The resolution for presently and readily available satellite data is on the order of 15 km. When considering an area of about 60 km×60 km, a 25×25 pixel grid may be generated.

Figure 5:
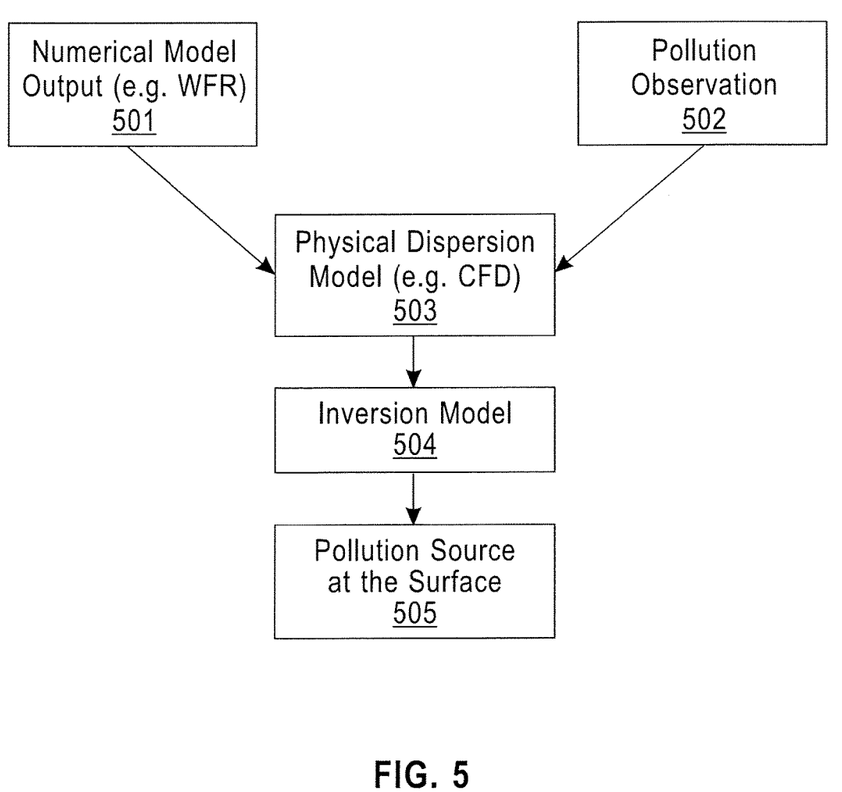
FIG. 5 is a flow chart illustrating an approach for generating a representation of a fine background pollution source using inversing CFD modeling in accordance with exemplary embodiments of the present invention.

Next, a fine background pollution source graphical representation may be generated using inversing CFD modeling (Step S402). FIG. 5 is a flow chart illustrating an approach for generating a representation of a fine background pollution source using inversing CFD modeling in accordance with exemplary embodiments of the present invention. There may be multiple approaches for performing this step, however, a single approach is described herein as an exemplary approach. First, a numerical model for atmospheric pollution may be provided (Step S501). This information may be used in combination with received pollution observations (Step S502) to generate a physical dispersion model (e.g. CFD), for example, as described above. The model may then be inverted (Step S504) to determine a degree of pollutant over the surface of the geographic area (Step S505).

After the CFD model has been created, the obtained satellite data may then be interpolated onto the CFD model grid (Step S403). This step may serve to calculate, for each pixel of the grid, what the pollution level. Thus the measure of pollution acquired by the satellite data $C(x,y)$, which may have a relatively high resolution, is used to create a measure of pollution within each pixel of the CFD data grid $S(x,y)$, which may have a relatively low resolution.

Next, according to some exemplary embodiments of the present invention, the CFD error may be calculated, as described above, in accordance with the ensemble approach (Step S404) (with the satellite error being known), and thereafter, the relative error levels may be used to combine CFD output and satellite observation output by weighing the elements using weighted coefficients which are based on the measure of relative error (Step S405).

However, according to the above-mentioned complementary approach, unlike conventional approaches for CFD analysis, in which there are a very limited number of observation points at which the CFD model may be anchored to the observed data, here each and every pixel of the relatively course satellite grid may be used as such an anchor point, and accordingly, an error between the CFD and the observed pollution level may be minimized at each pixel of the satellite grid.

This complementary approach may be used along with the above-described ensemble approach or either approach may be used without the other.

According to the ensemble approach, to integrate the CFD inversing model result and the satellite data, the sources for error may be understood. Generally, satellite data error may be the result of instrument error and the error inherent in the retrieving method used. However, the CFD inversing model error may be difficult to know. Exemplary embodiments of the present invention may use the ensemble method to calculate the error.

Assuming an ensemble weather forecast is provided, for example, from WRF, an ensemble CFD inversing model may be run and an ensemble output of $Cl(x,y), Cx( )x,y) \ldots Cn(x,y)$. Then, the CFD model error (Ec) may be estimated with the following formula:

$$Ec(x, y) = \frac{\sum_{n=1}^{N} \sqrt{(Cn(x, y) - \overline{C}(x, y))^2}}{N - 1}$$

where N is the number of ensemble members.

The CFD output may then be combined with the satellite observation by using weighted coefficients (Step S405). For example, the integrated pollution source, which is represented as $I(x,y)$, may be calculated as:

$$I(x,y) = a \times C(x,y) + b \times S(x,y)$$

where $a=Es \times Es/(Ec \times Ec + Eb \times Es)$ and $b=Ec \times Ec/(Ec \times Ec + Es \times Es)$ are the coefficients for $C(x,y)$ and $S(x,y)$, Ec and Eb are the std of $C(x,y)$ and $S(x,y)$. Accordingly, if Es has a larger error than Ec, then Ec may be more trusted and given more weight. Conversely, if Ec has a larger error than Es, then Es may be more trusted and given more weight. It may be understood that $a+b=1$, and accordingly, $I(x,y)=C(x,y)+b \times (S-C)$. Generally, Es may be constant for satellite and thus the value of Ec obtained in Step S404 may be used to generate the optimized pollution source in Step S405.

Figure 6:
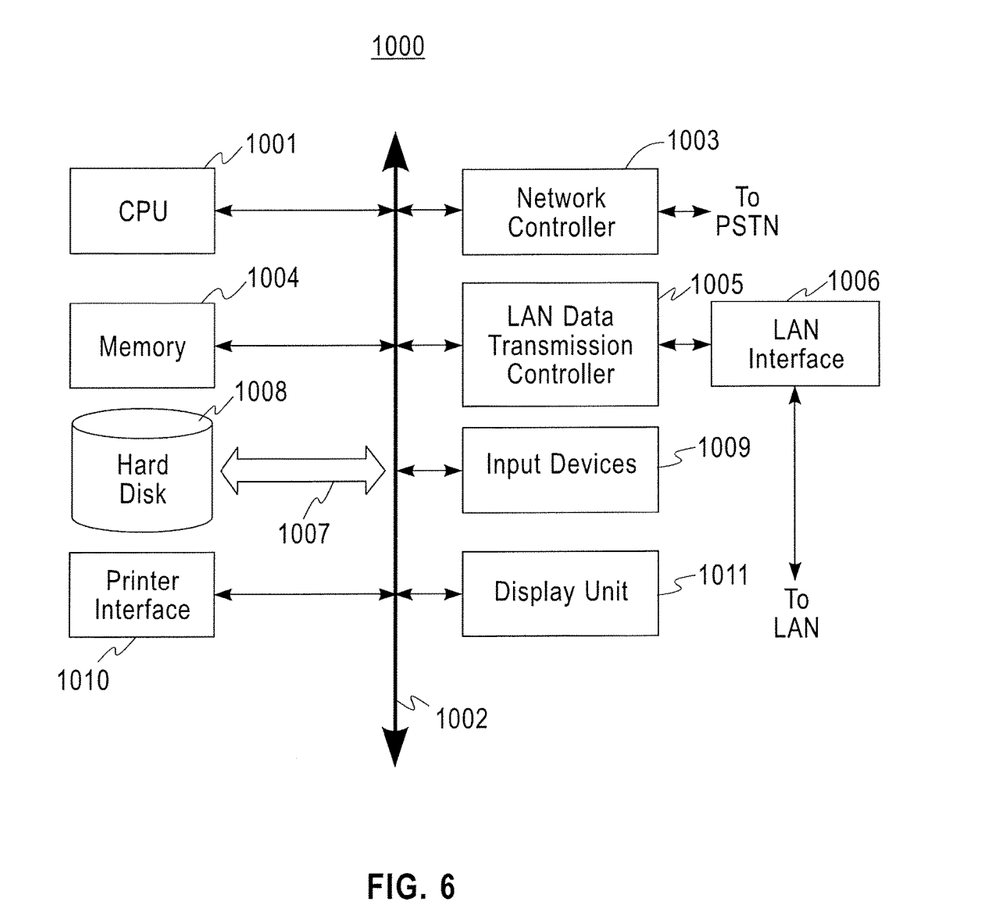
FIG. 6 shows an example of a computer system capable of implementing the method and apparatus according to embodiments of the present disclosure.

The above steps may be performed using various computational hardware. FIG. 6 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for modeling air pollution, comprising:
   receiving a weather model for a particular geographic region;
   receiving satellite-observed pollution observation data over the geographic region;
   generating a physical dispersion model for pollution over the geographic region using the received weather model;
   interpolating the received satellite-observed pollution observation data to the generated physical model; and
   combining the interpolated satellite-observed pollution observation data and the generated physical model using weighted coefficients for both the interpolated satellite-observed pollution observation data and the generated physical model to produce a hybrid weather model,
   wherein the weighted coefficients are calculated in accordance with a relative error in both the physical dispersion model and the satellite-observed pollution observation data, and
   wherein the hybrid weather model has a greater resolution than the received satellite-observed pollution observation data alone.

2. The method of claim 1, wherein the satellite-observed pollution observation data has a courser resolution than the physical dispersion model.

3. The method of claim 1, wherein the generated physical dispersion model is a computed fluid dynamics (CFD) model.

4. The method of claim 1, wherein the physical dispersion model is generated from the received weather model using one or more observed emissions levels taken at one or more observation stations.

5. The method of claim 1, wherein the physical dispersion model is generated from the received weather model using one or more observed emissions levels taken from the satellite-observed pollution observation data.

6. The method of claim 1, wherein the physical dispersion model is optimized by minimizing a difference between one or more observed emissions levels taken at one or more observation stations and calculated emissions levels at locations of the one or more observation stations that are calculated from the physical dispersion model.

7. The method of claim 1, wherein the physical dispersion model is optimized by minimizing a difference between one or more observed emissions levels taken from the satellite-observed pollution observation data at one or more locations and calculated emissions levels at the one or more locations that are calculated from the physical dispersion model.

8. The method of claim 1, wherein the relative error in both the physical dispersion model and the satellite-observed pollution observation data is calculate based on a calculated inversing model error of the physical dispersion model and a predetermined error of the satellite-observed pollution observation data.

9. The method of claim 1, further comprising displaying the combined interpolated satellite-observed pollution observation data and the generated physical dispersion model as a visual representation of air pollution levels over the particular geographic region.

10. A method for modeling air pollution, comprising:
    receiving a weather model for a particular geographic region;
    receiving satellite-observed pollution observation data over the geographic region;
    generating a physical dispersion model for pollution over the geographic region using the received weather model;
    interpolating the received satellite-observed pollution observation data to the generated physical model to produce a hybrid weather model; and
    optimizing the generated physical dispersion model by minimizing a difference between one or more observed emissions levels taken from the satellite-observed pollution observation data at one or more locations and calculated emissions levels at the one or more locations that are calculated from the physical dispersion model,
    wherein the hybrid weather model has a greater resolution than the received satellite-observed pollution observation data alone.

11. The method of claim 10, wherein the satellite-observed pollution observation data has a courser resolution than the physical dispersion model.

12. The method of claim 10, wherein the generated physical dispersion model is a computed fluid dynamics (CFD) model.

13. The method of claim 10, further comprising displaying the optimized physical dispersion model as a visual representation of air pollution levels over the particular geographic region.

14. A computer system comprising:
    a processor; and
    a non-transitory, tangible, program storage medium, readable by the computer system, embodying a program of instructions executable by the processor to perform method steps for modeling air pollution, the method comprising:
    receiving a weather model for a particular geographic region;
    receiving satellite-observed pollution observation data over the geographic region;
    generating a physical dispersion model for pollution over the geographic region using the received weather model;
    interpolating the received satellite-observed pollution observation data to the generated physical model; and
    combining the interpolated satellite-observed pollution observation data and the generated physical model using weighted coefficients for both the interpolated satellite-observed pollution observation data and the generated physical model to produce a hybrid weather model,
    wherein the weighted coefficients are calculated in accordance with a relative error in both the physical dispersion model and the satellite-observed pollution observation data, and
    wherein the hybrid weather model has a greater resolution than the received satellite-observed pollution observation data alone.

15. The computer system of claim 14, wherein the satellite-observed pollution observation data has a courser resolution than the physical dispersion model.

16. The computer system of claim 14, wherein the generated physical dispersion model is a computed fluid dynamics (CFD) model.

17. The computer system of claim 14, wherein the physical dispersion model is generated from the received weather model using one or more observed emissions levels taken at one or more observation stations.

18. The computer system of claim 14, wherein the physical dispersion model is generated from the received weather model using one or more observed emissions levels taken from the satellite-observed pollution observation data.

19. The computer system of claim 14, wherein the physical dispersion model is optimized by minimizing a difference between one or more observed emissions levels taken at one or more observation stations and calculated emissions levels at locations of the one or more observation stations that are calculated from the physical dispersion model.

20. The computer system of claim 14, further comprising displaying the combined interpolated satellite-observed pollution observation data and the generated physical dispersion model as a visual representation of air pollution levels over the particular geographic region.

* * * * *